United States Patent [19]
Masuda

[11] Patent Number: 5,475,326
[45] Date of Patent: Dec. 12, 1995

[54] PHASE SYNCHRONIZATION CIRCUIT HAVING A SHORT PULL-IN TIME AND A LOW JITTER

[75] Inventor: Kazuaki Masuda, Kanagawa, Japan

[73] Assignee: NEC Corporation, Tokyo, Japan

[21] Appl. No.: 317,531

[22] Filed: Oct. 4, 1994

[30] Foreign Application Priority Data

Oct. 4, 1993 [JP] Japan .................................. 5-247662

[51] Int. Cl.⁶ ............................. H03K 5/13; H03K 5/00
[52] U.S. Cl. ............................ 327/157; 327/148; 331/17
[58] Field of Search ........................... 327/147, 148, 327/150, 155, 156, 157, 159, 243, 291, 536; 331/17, 25

[56] References Cited

U.S. PATENT DOCUMENTS

| | | | |
|---|---|---|---|
| 5,081,427 | 1/1992 | Suarez | 331/12 |
| 5,105,160 | 4/1992 | Summers | 331/25 |
| 5,144,156 | 9/1992 | Kawasaki | 327/159 |
| 5,170,130 | 12/1992 | Ichahara | 327/157 |

FOREIGN PATENT DOCUMENTS 2-211718  8/1990  Japan .
4-241520  8/1992  Japan .

Primary Examiner—Timothy P. Callahan
Assistant Examiner—Dinh T. Le
Attorney, Agent, or Firm—Foley & Lardner

[57] ABSTRACT

In a phase synchronization circuit including a digital phase comparator, a synchronism discrimination circuit, a charge pump circuit, a loop filter, a voltage controlled oscillator, and a frequency-division circuit, the charge pump circuit comprises a level comparator comparing the output voltage of the loop filter with a predetermined reference voltage, for outputting a level discrimination signal, a first AND circuit for outputting a logical product of an output UP of the phase comparator and the level discrimination signal, an inverter for outputting an inverted signal of an output DOWN of the phase comparator, and a second AND circuit for outputting a logical product of an output signal of the inverter and the level discrimination signal. A PMOS transistor is connected at its source to a voltage supply through a constant current source, and has its gate applied with an output signal of the AND circuit, and its drain connected to an input of the loop filter, and an NMOS transistor is connected at its drain to the input of the loop filter and has its gate applied with an output signal of the AND circuit and its source connected to ground through a constant current source.

3 Claims, 5 Drawing Sheets

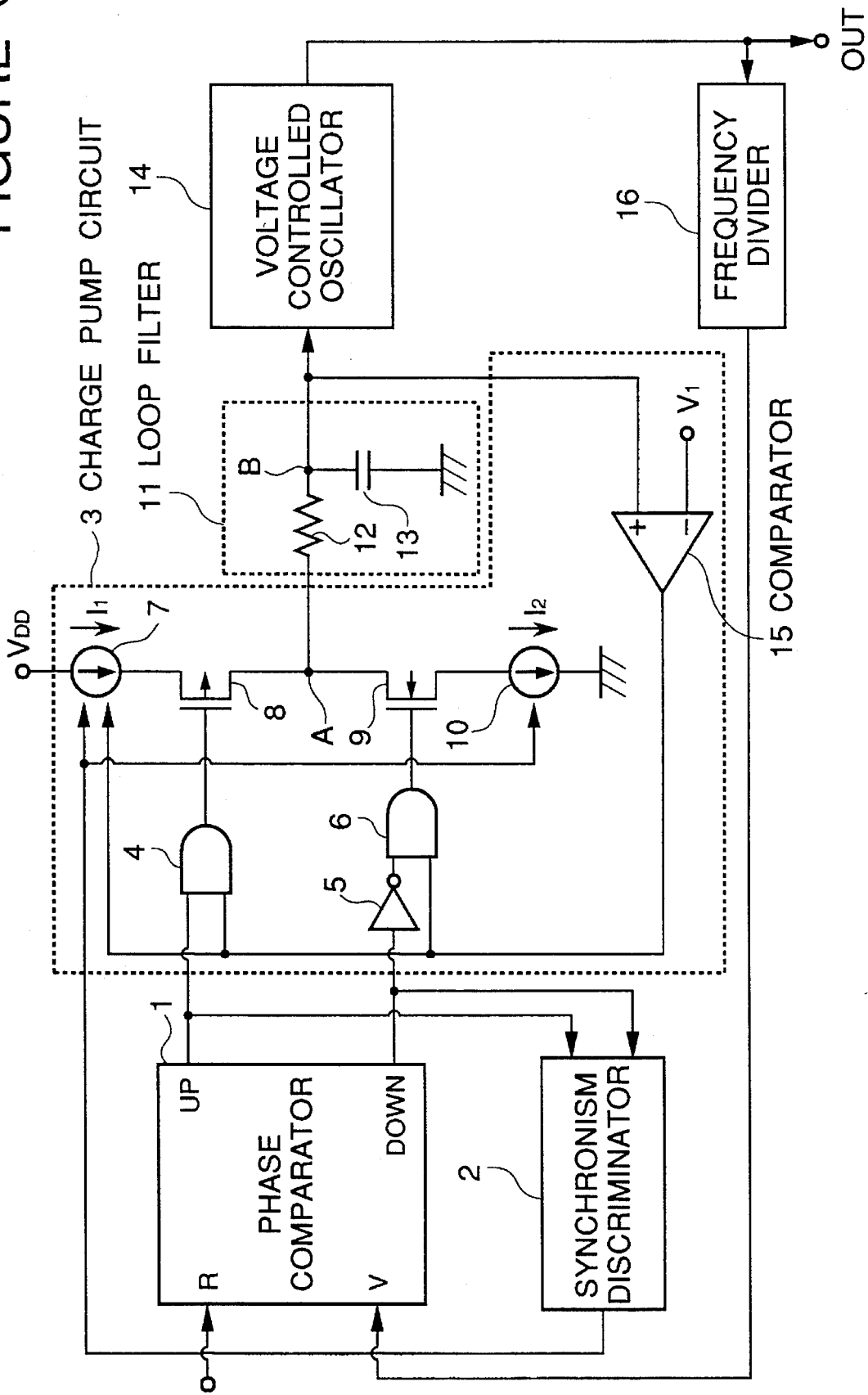

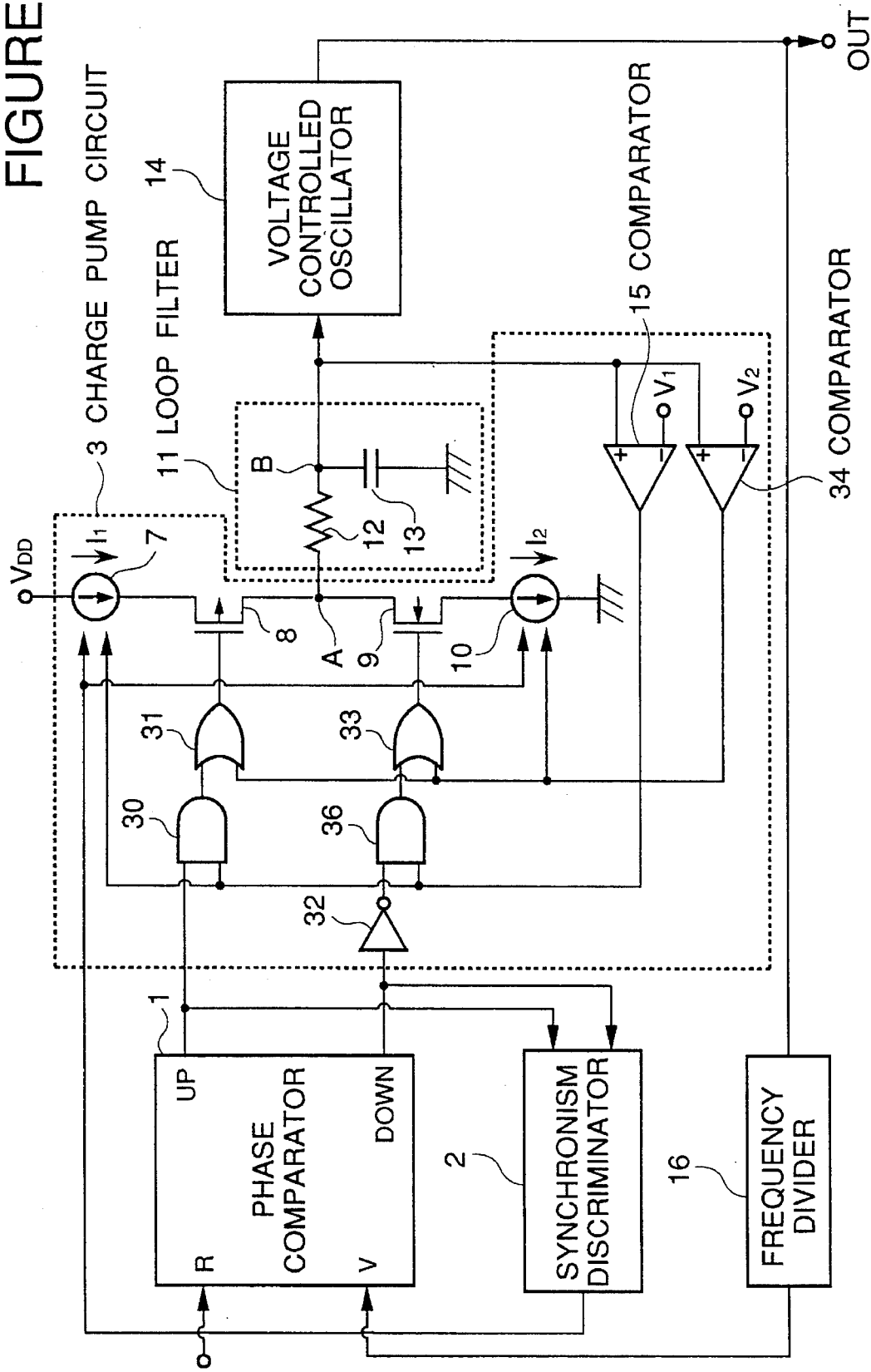

PHASE SYNCHRONIZATION CIRCUIT HAVING A SHORT PULL-IN TIME AND A LOW JITTER

BACKGROUND OF THE INVENTION

1. Field of the Invention

The present invention relates to a phase synchronization circuit.

2. Description of Related Art

Conventionally, various types Of phase synchronization circuits have been proposed. In order to realize a high-speed pull-in operation and a low jitter in a circuit configured to multiplying a frequency of an input signal, measures are taken to change a constant of a loop filter by means of a synchronism discrimination circuit (for example, Japanese Patent Application Laid-Open Publication No. JP-A-2-211718 and No. JP-A-4-241520).

One example of such conventional ones is shown in FIG. 1, which is composed of a phase comparator 1; a synchronism discrimination circuit 2; a charge pump circuit 3 comprising a constant current source 7 of a flow-out type (current value: $I_1$), a constant current source 10 of a flow-in type (current value: $I_2$), a PMOS transistor 8, an NMOS transistor 9 and an inverter 35; a loop filter comprising a resistor 12 and a capacitor 13; a voltage controlled oscillator 14; and a frequency-division circuit 16, which are connected as shown.

As the phase comparator 1 of FIG. 1, a circuit shown in FIG. 2 is well known, which is composed of NAND circuits 21, 22, 23, 24, 25, 26, 27, 28, and 29, which are connected as shown. In FIG. 2, an output UP and an output DOWN are ordinarily at a high level in response to an input R receiving a predetermined input signal and an input V receiving a frequency-divided output signal from the frequency-division circuit 16. When a trailing edge of the input R is in advance of a trailing edge of the input V, the output UP is brought to a low level during that period in which the trailing edge of the input R is in advance of the trailing edge of the input V.

On the contrary, when the trailing edge of the input R is delayed from the trailing edge of the input V, the output DOWN is brought to a low level during that period in which the trailing edge of the input R is delayed from the trailing edge of the input V. The loop filter 11, is a circuit for removing a noise generated in the phase comparator 1, and is generally constituted of a low pass filter.

The voltage controlled oscillator 14 is controlled by an output voltage of the loop filter 11 so that an oscillation frequency of the voltage controlled oscillator 14 is controlled in accordance with the output voltage of the loop filter 11, so as to generate an oscillation signal having a frequency corresponding to the output voltage of the loop filter 11. The frequency-division circuit 16 frequency-divides the oscillation frequency of the voltage controlled oscillator 14 so as to output a frequency-divided signal to the phase comparator 1, and is often constituted of a synchronizing counter.

In addition, the synchronism discrimination circuit 2 is composed of a well known circuit shown in FIG. 3; which is composed of a NAND circuit 17, a resistor 18, a capacitor 19 and an inverter 20, which are connected as shown. If the output UP or the output DOWN of the phase comparator 1 shown in FIG. 1 is at a low level for a long period of time, it is judged that a synchronization is not attained in the phase synchronization circuit.

Operation of the phase synchronization circuit will now be explained.

In FIG. 1, if the trailing edge of the input R of the phase comparator 1 is in advance of the trailing edge of the input V of the phase comparator 1 so that the output UP of the phase comparator 1 is brought to the low level and the output DOWN is at the high level, the PMOS transistor 8 turns ON and the NMOS transistor 10 turns OFF. As a result, the capacitor 13 is charged through the constant current source 7 and the PMOS transistor 8, and a potential $V_B$ of a connecting node B rises up, which increases the oscillation frequency of the voltage controlled oscillator 14.

On the contrary, if the trailing edge of the input R of the phase comparator 1 becomes delayed from the trailing edge of the input V of the phase comparator 1 so that the output UP of the phase comparator 1 is at a high level and the output DOWN is brought to a low level, the PMOS transistor 8 turns OFF and the NMOS transistor 10 turns ON. Accordingly, the capacitor 13 is discharged through the constant current source 10 and the NMOS transistor 9, and the potential $V_B$ of the connecting node B falls down, which lowers the oscillation frequency of the voltage controlled oscillator 14.

If the output UP or the output DOWN of the phase comparator 1 is at a low level for a long period of time, it is discriminated in the synchronism discrimination circuit 2, that the synchronization is not attained in the synchronization circuit. In this case, by means of the control signal generated by the synchronism discrimination circuit 2, the current values of the constant current source 7 and the constant current source 10 are made large, so that a synchronization is quickly attained.

Thereafter, if the phase synchronization circuit becomes in a synchronized condition so that the time period of the low level of the output UP or the output DOWN of the phase comparator 1 becomes short, or else both of the output UP and the output DOWN are always at a high level, the current values of the constant current source 7 and the constant current source 10 is decreased under control of the control signal outputted from the synchronism discrimination circuit 2, whereby a low jitter control can be realized in the phase synchronization circuit.

The constant current source 7 and the constant current source 10 are designed to have the same current value so that they have the same amount of phase adjustment. In this case, if it is assumed that the same current value is I ($I_1=I_2=I$), a capacitance value of the capacitor 13 is $C_{13}$, an inherent angular frequency of the phase synchronization circuit is $\omega_n$, a damping coefficient is $\xi$, a gain of the voltage controlled oscillator 14 is K, a frequency-division ratio of the frequency-division circuit 16 is N, and a resistance value of the resistor 12 of the loop filter 11 is $R_{12}$, I and R can be represented as follows:

$$I = \omega_n^2 \cdot N \cdot C_{13}/K \qquad (1)$$

$$R_{12} = 2\xi/(\omega_n \cdot C_{13}) \qquad (2)$$

In addition, an input voltage $V_{IN}$ of the voltage controlled oscillator 14 is exactly the same as a voltage $V_B$ on the node B which has been generated by the fact that an electric charge is charged into the capacitor 13 during a period of time required for the current value I to be detected in the phase comparator 1. The oscillation frequency f of the voltage controlled oscillator 14 corresponding to this input voltage $V_{IN}$ is represented by the following equation:

$$f = V_{IN} \cdot K \quad (3)$$

By using above mentioned equations (1), (2) and (3) on the condition that N=512 (input frequency of 8 KHz, output frequency 4.096 MHz), $C_{13}$=60 pF, K=2.0 MHz/V, R=25 M$\xi$, the current value I of the constant current source in the synchronized condition is equal to 40 nA, the current value I of the constant current source in the non-synchronized condition is equal to 400 nA, $\omega_n$=2π×256 rad/s, $\xi$=1.2, the change in time of the oscillation frequency f of the voltage controlled oscillator 14 is calculated, and the characteristic curve 101 shown in FIG. 5 is obtained. Given the time $t_r$ which elapses before the oscillation frequency f becomes constant is a pull-in time, $t_r$=7 ns.

The phase synchronization circuit is generally used in various applications. For example, when it is used for PCM CODEC, that is to say in the system required to have a constant frequency all the time, the voltage level of the output voltage $V_B$ of the loop filter 11 is maintained, in a synchronized condition, at the same level as that of a voltage $V_0$ which is shown in the characteristics of the voltage controlled oscillator shown in FIG. 4.

However in the conventional phase synchronization circuits, the charging/discharging operation of the capacitor 13 during a pull-in process for synchronization is conducted only when the output UP or the output DOWN of the phase comparator 2 is at a low level. Therefore, there is a disadvantage that when both the output UP and the output DOWN of the phase comparator 1 are at a high level, the capacitor 13 is neither charged nor discharged even under the condition that there is a large difference in voltage level between the voltage $V_B$ and the $V_0$. Consequently, the pull-in time for the phase synchronization becomes long.

SUMMARY OF THE INVENTION

Accordingly, it is an object of the present invention to provide a phase synchronization circuit which has overcome the above mentioned defect of the conventional one.

Another object of the present invention is to provide a phase synchronization circuit having a charge pump circuit, which is capable of shortening a phase synchronization pull-in time, without damaging the jitter characteristics after the phase synchronization has been attained.

The above and other objects Of the present invention are achieved in accordance with the present invention by a phase synchronization circuit which includes:

a digital phase comparator receiving a predetermined input signal at a first input, a synchronism discrimination circuit receiving said output of the phase comparator, for discriminating a phase synchronization condition so as to output a control signal, a charge pump circuit receiving the output of the phase comparator, and controlled by the control signal, for outputting a phase differential signal, a loop filter receiving the phase differential signal of the charge pump circuit, for limiting a frequency band of the phase differential signal, a voltage controlled oscillator frequency-controlled by an output voltage of the loop filter for providing an output signal at an output terminal, and a frequency-division circuit receiving an output signal of the voltage controlled oscillator, for frequency-dividing the Output signal of the voltage controlled oscillator and for feeding back a frequency-divided output signal to a second input of the phase comparator, wherein the charge pump comprises:

a level comparator receiving the output voltage of the loop filter for comparing it with a predetermined reference voltage so as to output a predetermined level discrimination signal, a first AND circuit receiving a first output signal of the phase comparator and the level discrimination signal, for outputting a logical product signal, an inverter receiving a second output signal of the phase comparator for outputting an inverted signal of the second output signal, a second AND circuit receiving the inverted signal outputted from the inverter and the level discrimination signal, for outputting a logical product signal, a PMOS transistor having its source connected to a voltage supply through a first constant current source, its gate connected to receive an output signal of the first AND circuit, and its drain connected to an input of the loop filter, and an NMOS transistor having its drain connected to the input of the loop filter, its gate connected to receive an output signal of the second AND circuit, and its source connected to ground through a second constant current source, a current value of the first constant current source being controlled by the control signal outputted from the synchronism discrimination circuit and the level discrimination signal, and a current value of the second constant current source being controlled by the control signal outputted from the synchronism discrimination circuit.

According to a second aspect of the second invention, there is provided a phase synchronization circuit which includes:

a digital phase comparator, a synchronism discrimination circuit receiving an output of the phase comparator, for discriminating a please synchronization condition so as to output a control signal, a charge pump circuit receiving the output of the phase comparator, and controlled by the control signal, for outputting a phase differential signal, a loop filter receiving the phase differential signal of the charge pump circuit, for limiting a frequency band of the phase differential signal, a voltage controlled oscillator frequency-controlled by an output voltage of the loop filter, and a frequency-division circuit receiving an output signal of the voltage controlled oscillator, for frequency-dividing the output signal of the voltage controlled oscillator and for feeding back a frequency-divided output signal to the phase comparator, wherein the charge pump comprises:

a first level comparator receiving the output voltage of the loop filter for comparing it with a first predetermined reference voltage so as to output a first predetermined level discrimination signal, a second level comparator receiving the output voltage of the loop filter for comparing it with a second predetermined reference voltage so as to output a second predetermined level discrimination signal, an AND circuit receiving a first output signal of the phase comparator and the first level discrimination signal, for outputting a logical product signal, a first OR circuit receiving an output signal of the AND circuit and the second level discrimination signal, for outputting a logical sum signal, an inverter receiving a second output signal of the phase comparator for outputting an inverted signal of the second output signal, a second OR circuit receiving an output signal of the inverter and the second level discrimination signal, for outputting a logical sum signal, a PMOS transistor having its source connected to a voltage supply through a first constant current source, its gate connected to receive an output signal of the first OR circuit, and its drain connected to an input of the loop filter, and an NMOS transistor having its drain connected to the input of the loop filter, its gate connected to receive an output signal of the second OR circuit, and its source connected to ground through a second constant current source, a current value of the first constant current source being controlled by the control signal outputted form the synchronism discrimination circuit and the first level discrimination signal, and a current value of the second constant current source being controlled by the control signal outputted form the synchronism discrimination circuit and the second level discrimination signal.

The above and other objects, features and advantages of the present invention will be apparent from the following description of preferred embodiments of the invention with reference to the accompanying drawings.

BRIEF DESCRIPTION OF THE DRAWINGS

FIG. 6 is a block diagram of the first embodiment of the phase synchronization circuit in accordance with the present invention; and FIG. 7 is a block diagram of the second embodiment of the phase synchronization circuit in accordance with the present invention;

DESCRIPTION OF THE PREFERRED EMBODIMENTS

The present invention will now be described with reference to the the accompanying drawings.

Figure 1:
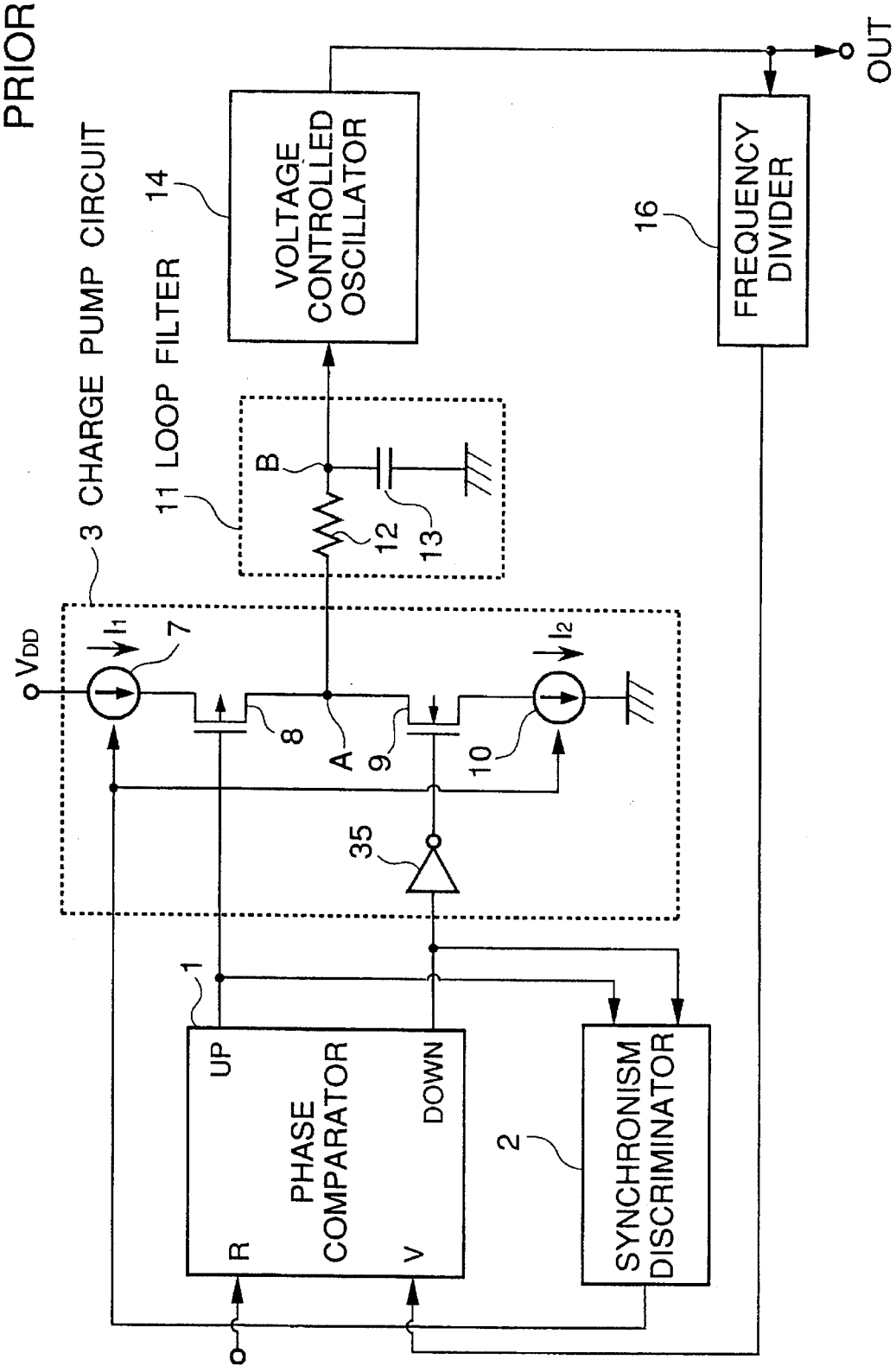
FIG. 1 is a block diagram showing a conventional example.
Figure 2:
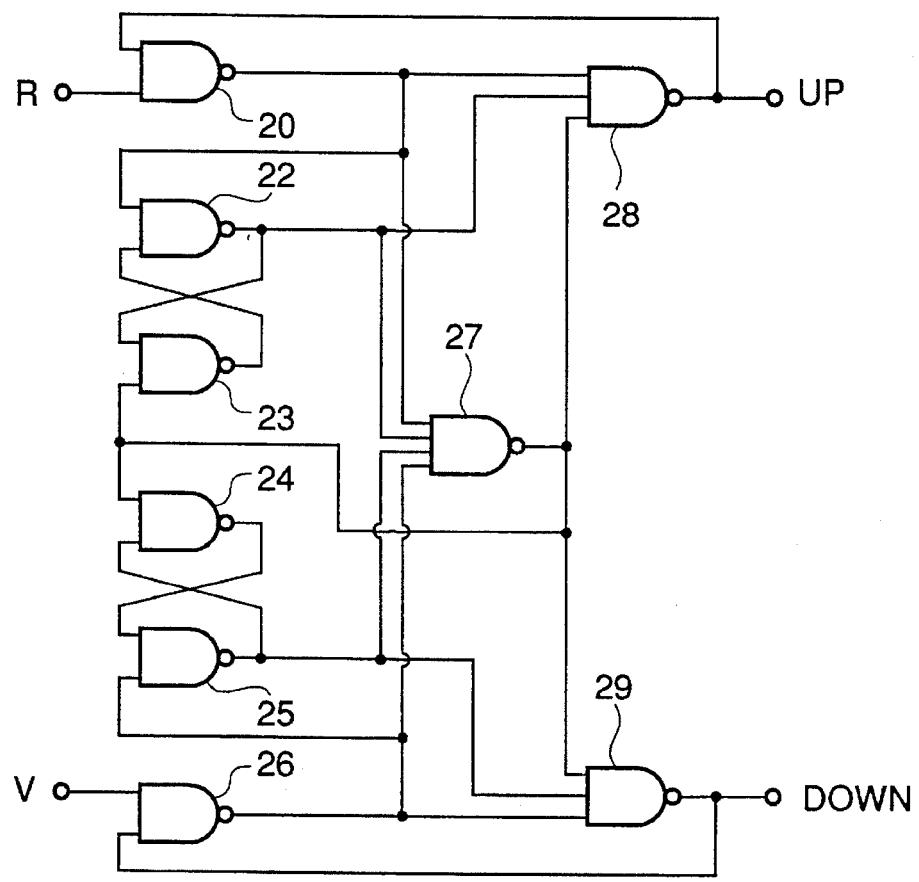
FIG. 2 a circuit diagram showing one example of the phase comparator used in the first embodiment.
Figure 3:
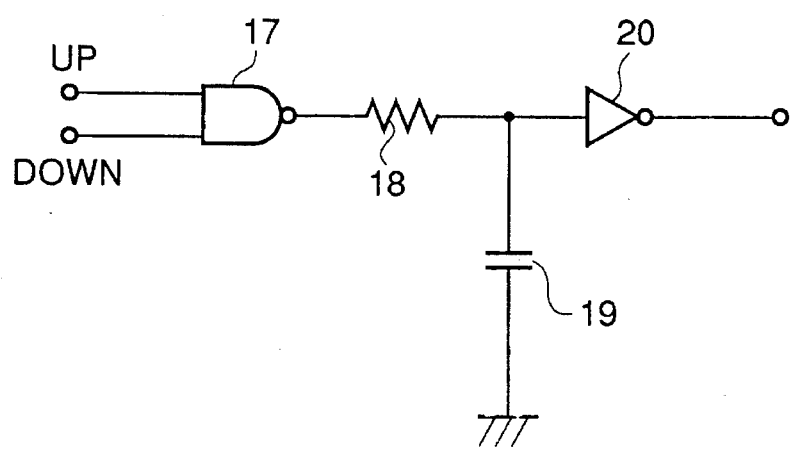
FIG. 3 is a circuit diagram showing one example of the phase synchronism discrimination circuit used in the first embodiment.

FIG. 6 shows a block diagrams of a first embodiment of the phase synchronization circuit in accordance with the present invention, In FIG. 6 elements similar to those shown in FIG. 1 are given the same Reference Numerals.

As shown in FIG. 6, this embodiment includes a phase comparator 1 having an input R receiving a predetermined input signal and an input V receiving a frequency-divided output signal, and also having an output UP and an output DOWN, which are connected to a synchronism discrimination circuit 2 and a charge pump circuit 3.

This charge pump circuit 3 comprises an AND circuit 4 having a first input connected to the output UP of the phase comparator 1, an inverter 5 having an input connected to the output DOWN of the phase comparator 1, and an AND circuit 6 having a first input connected to an output of the inverter 5.

The charge pump circuit 3 also includes a PMOS transistor (P-channel MOS (metal-oxide-semiconductor field effect transistor)) 8 having its source connected to a voltage supply $V_{DD}$ through a first constant current source 7 of the flow-out type, its gate connected to receive an output signal of the AND circuit 4, and its drain connected to a node A, and an NMOS transistor (N-channel MOS (metal-oxide-semiconductor field effect transistor)) 9 having its drain connected to the node A, its gate connected to receive an output signal of the AND circuit 6, and its source connected to ground through a second constant current source 10 of the flow-in type.

The constant current source 7 is controlled by an output of the synchronism discriminator 2 and a level comparator 15, so that the amount of current flowing through the constant current source 7 is adjusted to become large or small. Similarly, the constant current source 10 by the output of the synchronism discriminator 2, so that the amount of current flowing through the constant current source 10 is adjusted to become large or small.

An output of the charge pump circuit 3, namely, the node A is connected to a loop filter 11, which comprises a resistor 12 connected at its one end to the node A and at its other end to another node B, and a capacitor 13 having one end connected to the node B and the other end connected to ground. An output of this loop filter 11, namely, the node B is connected to a non-inverting input of the level comparator 15, which has its inverting input connected to a reference voltage $V_1$ explained hereinafter. The node B is also connected to an input of a voltage controlled oscillator 14, which has an output connected to an output OUT and an input of a frequency-division circuit 16. An output of the frequency-division circuit 16 is connected to the input V of the phase comparator 1.

As clearly seen from comparison between FIGS. 1 and 6, the first embodiment is different from the conventional example in the construction of the charge pump circuit which is one of the components of the phase synchronization circuit. Namely, the charge pump circuit of the conventional example is composed of the constant current sources 7 and 10, the PMOS transistor 8, the NMOS transistor 9, and the inverter 35. In this embodiment, on the contrary, the charge pump circuit 3 of the first embodiment comprises, as stated above, the AND circuits 4 and 6, the inverter 5, the constant current sources 7 and 10, the PMOS transistor 8, the NMOS transistor 9 and the comparator 15.

Figure 4:
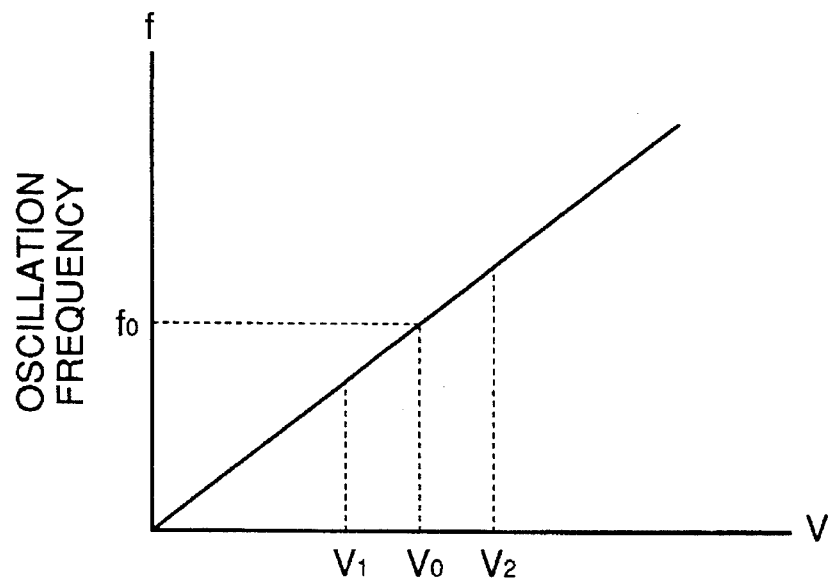
FIG. 4 is a graph showing the oscillation frequency characteristics of the voltage controlled oscillator.

In FIG. 6, the non-inverting input of the comparator 15 is applied with the output of the loop filter 11, that is, a potential $V_B$ at the connecting node B connected to the input of the voltage controlled oscillator 14. The inverting input of the comparator 15 is applied with the reference voltage $V_1$, which has a level lower than that of the voltage $V_0$ shown in FIG. 4.

If the phase synchronization circuit is not in the synchronized condition and the level of the potential $V_B$ of the connecting node B gradually falls down to a level lower than the reference voltage $V_1$, the output level of the comparator 15 is brought to a low level, which is applied to the AND circuits 4 and 6, as well as to the constant current source 7 as a control signal for Shifting its current value to a large current in this case.

Furthermore, in the situation that the phase synchronization circuit is not in the synchronized condition and the level of the potential $V_B$ of the connecting node B fails down to a level lower than the reference voltage $V_1$ by action of the discharge of the capacitor 13, respectively input paths from the output UP and the output DOWN of the phase comparator 1 to the PMOS transistor 8 and the NMOS transistor 9, are shut down by means of a gate function of the AND circuits 4 and 6, so that the low level signal is applied to the gate of each of the POMS transistor 8 and the NMOS transistor 9.

In this case, the PMOS, transistor 8 turns ON and the NMOS transistor 9 turns OFF, regardless of the output of the phase comparator 1, so that the loop filter 11 and the voltage controlled oscillator 14 of the phase synchronization circuit are brought into a phase synchronizing pull-in operation. Because of this, the capacitor 13 is charged with a large current $I_1$ through the constant current source 7 and the PMOS transistor 8, which increases the potential $V_B$ of the connecting node B so that it will exceed the reference voltage $V_1$.

As a result, the oscillation frequency of the voltage controlled oscillator 14 is shifted to a high-frequency, which is then applied to the input V of the phase comparator 1 through the frequency-division circuit 16. In this way, when the output DOWN of the phase comparator 1 stays at a low level, the phase synchronization circuit is forced to restore the phase pull-in condition by action of a level comparing function of the comparator 15. Accordingly, the time required to attain the synchronized condition is shortened.

On the other hand, when the level of the potential $V_B$ of the connecting node B exceeds the reference voltage $V_1$ applied to the inverting input of the comparator 15, the output level of the comparator. 15 is brought to a high level, which is applied to the AND circuits 4 and 6 as well as to the constant current source 7 so as to limit the current of the constant current source 7.

Furthermore, when the potential $V_B$ of the connecting node B exceeds the level of the reference voltage $V_1$, the output UP and the output DOWN of the phase comparator 1 are applied normally to the gate of PMOS transistor 8 and the NMOS transistor 9 by the gate function of the AND circuits 4 and 6, respectively.

Accordingly, a normal working condition of the phase synchronization circuit is restored. In this case, the operation of the phase synchronization circuit is carried out by means of the output UP and the output DOWN of the phase comparator 1, and when the output UP or the output DOWN stays at a low level for long time of period, the synchronism discrimination circuit 2 discriminates that the synchronization is not attained in the phase synchronization circuit, and carries out the control operation for making the current values of the constant current source 7 and the, constant current value 10 large.

On the other hand, if the output UP and the output DOWN stays at a low level only for a short period of time, the synchronism discrimination circuit 2 concludes that the synchronization is attained in the phase synchronization circuit, and carries out the control operation for making the current values of the constant current source 7 and the constant current source 10 small. In the synchronism discrimination circuit 2, furthermore, as a condition or standard for discriminating the phase synchronization, it is determined whether the phase difference detected by the phase comparator 1 was caused by a jitter which occurred after the synchronization has been attained in the phase synchronization circuit or it was detected because the synchronization has not yet been attained. For this purpose, the discrimination of synchronization/non-synchronization is performed by using, as a criterion, a value slightly bigger than the width of a jitter occurred in the phase synchronization circuit.

FIG. 7 shows a block diagram of the second embodiment of the phase synchronization circuit in accordance with the present invention. In FIG. 7, elements similar to those shown in FIG. 6 are given the same Reference Numerals, and explanation of the construction thereof will be omitted.

As clearly seen from the comparison between FIGS. 6 and 7, this second embodiment is different from the first embodiment in the construction of the charge pump circuit which is one of the components of the phase synchronization circuit. Namely, the charge pump circuit 3 of the second embodiment is composed of an AND circuit 30 having a first input connected to the output UP of the phase comparator 1 and a second input connected to the output of the level comparator 15, an OR circuit 31 having a first input connected to an output of the AND circuit 30. The charge pump circuit 3 also comprises an inverter 32 having an input connected to the output DOWN of the phase comparator 1, an AND circuit 36 having a first input connected to an output of the inverter 32 and a second input connected to the output of the level comparator 15, and an OR circuit 33 having a first input connected to an output of the AND circuit 6. An output of the OR circuit 31 is connected to the gate of the PMOS transistor 8, and an output of the OR circuit 33 is connected to the gate of the NMOS transistor 9. In addition, the output of the loop filter 11, namely, the node B, is connected not only the level comparator 15 but also a non-inverting input of another level comparator 34, which has its inverting input connected to another reference voltage $V_2$ which will be explained hereinafter. An output of this level comparator 34 is connected to a second input of each of the OR circuits 31 and 33. Furthermore, the current source 10 is controlled by not only the output of the synchronism discriminator 2 and the output of the level comparator 34.

In FIG. 7, similarly to the first embodiment, the non-inverting input of the comparator 15 is applied with the output of the loop filter 11, that is, the potential $V_B$ of the connecting node B connected to the input side of the voltage controlled oscillator 14. The inverting input of the comparator 15 is applied with the reference voltage $V_1$ having a level lower than the voltage $V_0$ shown in FIG. 4. The non-inverting input of the comparator 34 is applied with the potential $V_B$ of the connecting node B, and the inverting input of the comparator 34 is applied with a reference voltage $V_2$, which has a level higher than that of a voltage $V_0$ shown in FIG. 4.

The comparator 15 operates in the same manner as the first embodiment. Namely, when thee potential $V_B$ of the connection node B gradually falls down to a level lower than the reference voltage $V_1$, the output level of the comparator 15 is brought to a low level, which is then applied to the AND circuits 30 and 36, as well as to the constant current source 7 as a control signal for shifting its current value to a large current. In this situation, the output signal of the comparator 34 is also at a low level.

Accordingly, the PMOS transistor 8 turns to ON regardless of the level of the output UP of the phase comparator 1, so that the loop filter 1 and the voltage controlled oscillator 14 of the phase synchronization circuit are brought into the phase pull-in operation condition. As a result, the capacitor 13 is charged with a large current $I_1$ through the constant current source 7 and the PMOS transistor 8, which increases the potential $V_B$ of the connecting node B so that it will exceed the reference voltage $V_1$. Then, the oscillation frequency of the voltage controlled oscillator 14 is caused to shift to a high frequency, which is then applied to the input V of the phase comparator 1 through the frequency-division circuit 16.

In this way, when $V_B<V_1$, the phase synchronization circuit is forced to restore the phase pull-in operation condition by means of a level comparing function of the comparators 15 and 34. Accordingly, the time required to attain the synchronized condition is shortened.

On the other hand, if the level of the potential $V_B$ of the connecting node B gradually rises up, and then, exceeds the level of the reference voltage $V_2$, the output level of the comparator 34 is then brought to a high level, which is in turn applied to the OR circuit 31 and the OR circuit 33, as well as to the constant current source 10 as a control signal for shifting its current value to a large current.

Under this situation, the output signal of the comparator 15 is also at a high level. As a result, the NMOS transistor 9 turns ON regardless of the level of the output DOWN of the phase comparator 1, and the loop filter 11 and the voltage controlled oscillator 14 of the phase synchronization circuit are brought under the phase pull-in operation condition.

Namely, the capacitor 13 is discharged with the large current $I_2$ through the constant current source 10 and the NMOS transistor 9, so that the potential $V_B$ of the connecting node B is caused to drop to a level lower than that of the reference voltage $V_2$. Accordingly, an oscillation frequency of the voltage controlled oscillator 14 is caused to shift to a low frequency, which is then applied into the input V of the phase comparator 1 through the frequency-division circuit 16.

In this way, in response to the situation where the output UP of the phase comparator 1 stays at a low level, the phase synchronization circuit is forced to restore the phase pull-in condition by action of a level comparing function of the comparators 15 and 34. Therefore, the time required to attain the synchronized condition is shortened.

If, as the result of the above mentioned operations, the potential $V_B$ of the connecting node B, namely the input voltage of the voltage controlled oscillator 14 is brought to a voltage level between $V_1$ and $V_2$, the outputs of the comparator 15 and the comparator 34 are brought to a high level and a low level, respectively.

There is thus formed a path starting from the output UP of the phase comparator 1 to pass through the AND circuit 30 and the OR circuit 31 and to reach the gate of the PMOS transistor 8. There is also formed a path starting from the output DOWN of the phase comparator 1 to pass through the inverter 32 and via the OR circuit 33 and to reach to the gate of the NMOS transistor 9.

Accordingly, the phase synchronizing circuit of the second embodiment assumes the circuit connection construction exactly identical to that of a proper phase synchronization circuit, and the synchronized condition is attained in a short period of time when the potential $V_B$ at the connecting node B is close to $V_0$.

Figure 5:
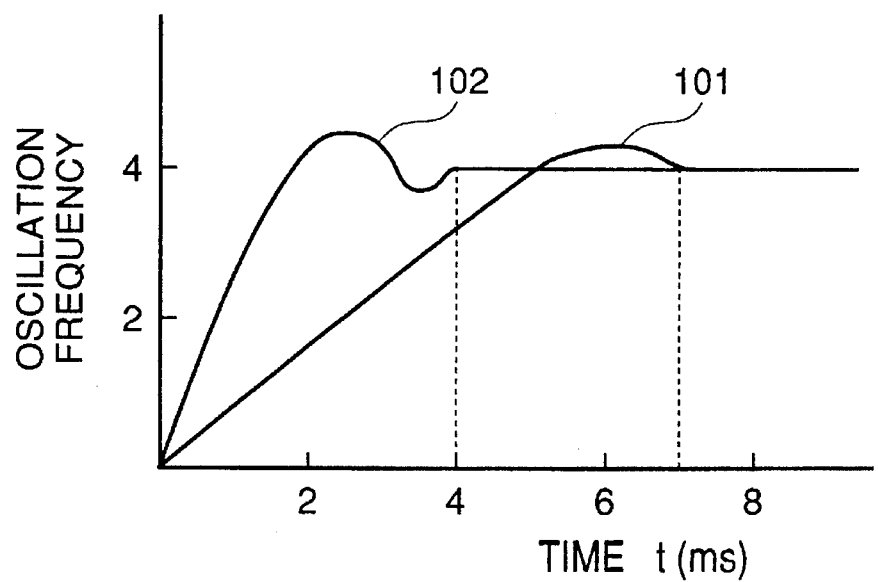
FIG. 5 is a graph showing the synchronization pull-in characteristics of the phase synchronizing circuit.

For the above mentioned first and second embodiments, a calculation is conducted by using the above mentioned equations (1), (2) and (3) and under the numerical condition that N=512 (input frequency: 8 KHz, output frequency: 4.096 MHz), C=60 pF, K=2.0 MHz/V, R=25 MHz, a current value I of the constant current source in a synchronized condition is 40 nA, a current value I of the constant current source in a non-synchronized condition is 400 nA, an inherent angular frequency $\omega_n=2\pi\times256$ rad/s, a damping coefficient $\xi=1.2$. If the change in time of the oscillation frequency f of the voltage controlled oscillator 14 is calculated, the oscillation frequency characteristics shown by the line 102 in FIG. 5 is obtained. The synchronization pull-in time $t_r$ which elapses before the oscillation frequency becomes constant, is represented as $t_r=4$ ns. This synchronization pull-in time $t_r$ is not larger than 60% of the value of the above mentioned conventional example.

As explained above, when the voltage level outputted form the charge pump circuit and then applied to the input of the voltage controlled oscillator is greatly different from that of the predetermined voltage level corresponding to the phase synchronized condition, the synchronization pull-in takes a long time. To deal with this situation, the present invention advantageously makes it possible to shorten the synchronization pull-in time by controlling the discharge current in comparison with the capacitance of the loop filter, and while keeping a low jittering characteristics after the synchronization pull-in operation has been completed.

The invention has thus been shown and described with reference to the specific embodiments. However, it should be noted that the present invention is in no way limited to the details of the illustrated structures but changes and modifications may be made within the scope of the appended claims.

I claim:

1. A phase synchronization circuit which includes a digital phase comparator receiving a predetermined input signal at a first input, a synchronism discrimination circuit receiving an output of said phase comparator, for discriminating a phase synchronization condition so as to output a control signal, a charge pump circuit receiving the output of said phase comparator, and controlled by said control signal, for outputting a phase differential signal, a loop filter receiving said phase differential signal of said charge pump circuit, for limiting a frequency band of said phase differential signal, a voltage controlled oscillator frequency-controlled by an output voltage of said loop filter for providing an output signal at an output terminal; and a frequency-division-circuit receiving said output signal of said voltage controlled oscillator, for frequency-dividing said output signal of said voltage controlled oscillator and for feeding back a frequency-divided output signal to a second input of said phase comparator, characterized in that said charge pump comprises:

a level comparator receiving said output voltage of said loop filter for comparing it with a predetermined reference voltage so as to output a predetermined level discrimination signal, a first AND circuit receiving a first output signal of said phase comparator and said level discrimination signal, for outputting a logical product signal, an inverter receiving a second output signal of said phase comparator for outputting an inverted signal of said second output signal, a second AND circuit receiving said inverted signal outputted from said inverter and said level discrimination signal, for outputting a logical product signal, a PMOS transistor having its source connected to a voltage supply through a first constant current source, its gate connected to receive an output signal of said first AND circuit, and its drain connected to an input of said loop filter, and an NMOS transistor having its drain connected to said input of said loop filter, its gate connected to receive an output signal of said second AND circuit, and its source connected to ground through a second constant current source, a current value of said first constant current source being controlled by said control signal outputted from said synchronism discrimination circuit and said level discrimination signal, and a current value of said second constant current source being controlled by said control signal outputted from said synchronism discrimination circuit.

2. A phase synchronization circuit which includes a digital phase comparator receiving a predetermined input signal at a first input, a synchronism discrimination circuit receiving an output of said phase-comparator, for discriminating a phase synchronization condition so as to output a control signal, a charge pump circuit receiving the output of said phase comparator, and controlled by said control signal, for outputting a phase differential signal, a loop filter receiving said phase differential signal of said charge pump circuit, for limiting a frequency band of said phase differential signal, a voltage controlled oscillator frequency-controlled by an output voltage of said loop filter for providing an output signal at an output terminal, and a frequency-division circuit receiving said output signal of said voltage controlled oscillator, for frequency-dividing said output signal of said voltage controlled oscillator and for feeding back a frequency-divided output signal to a second input of said phase comparator, characterized in that said charge pump comprises:

a first level comparator receiving said output voltage of said loop filter for comparing it with a first predetermined reference voltage so as to output a first predetermined level discrimination signal, a second level comparator receiving said output voltage of said loop filter for comparing it with a second predetermined reference voltage so as to output a second predetermined level discrimination signal, an AND circuit receiving a first output signal of said phase comparator and said first level discrimination signal, for outputting a logical product signal, a first OR circuit receiving an output signal of said AND circuit and said second level discrimination signal, for outputting a logical sum signal, an inverter receiving a second output signal of said phase comparator for outputting an inverted signal of said second output signal, a second OR circuit receiving an output signal of said inverter and said second level discrimination signal, for outputting a logical sum signal, a PMOS transistor having its source connected to a voltage supply through a first constant current source, its gate connected to receive an output signal of said first OR circuit, and its drain connected to an input of said loop filter, and an NMOS transistor having its drain connected to said input of said loop filter, its gate connected to receive an output signal of said second OR circuit, and its source connected to ground through a second constant current source, a current value of said first constant current source being controlled by said control signal outputted from said synchronism discrimination circuit and said first level discrimination signal, and, a current value of said second constant current source being controlled by said control signal outputted from said synchronism discrimination circuit and said second level discrimination signal.

3. A phase synchronization circuit claimed in claim 2 wherein said charge pump further comprises a second AND circuit receiving said output signal of said inverter and said first level discrimination signal, for outputting a logical product signal, which is supplied to said second OR circuit as said output signal of said inverter.

* * * * *